United States Patent [19]

Ternullo, Jr. et al.

[11] Patent Number: 6,060,873
[45] Date of Patent: May 9, 2000

[54] ON-CHIP-GENERATED SUPPLY VOLTAGE REGULATOR WITH POWER-UP MODE

[75] Inventors: Luigi Ternullo, Jr.; Michael C. Stephens, Jr.; Jeffrey S. Earl, all of San Jose, Calif.

[73] Assignee: Vanguard International Semiconductor Corporation, Hsinchu, Taiwan

[21] Appl. No.: 09/266,006

[22] Filed: Mar. 12, 1999

[51] Int. Cl.[7] .................................................. G05F 3/16
[52] U.S. Cl. ............................................................ 323/316
[58] Field of Search ............................ 373/316; 327/543, 327/544

[56] References Cited

U.S. PATENT DOCUMENTS

| | | | |
|---|---|---|---|
| 5,189,319 | 2/1993 | Murakami et al. | 323/314 |
| 5,511,026 | 4/1996 | Cleveland et al. . | |
| 5,521,547 | 5/1996 | Tsukada . | |
| 5,861,771 | 1/1999 | Matsuda et al. | 323/313 |

*Primary Examiner*—Shawn Riley
*Attorney, Agent, or Firm*—Christensen O'Connor Johnson & Kindness PLLC

[57] ABSTRACT

A regulator system for an on-chip-generated supply voltage includes a voltage detection circuit, a power-up mode detection circuit, a normal mode detection path, and a power-up detection path. The voltage detection circuit monitors the on-chip-generated supply voltage and generates a signal that indicates the level of this supply voltage. The power-up mode detection circuit detects when the chip is in the power-up mode and generates a path select signal. The path select signal causes the regulator system to select the power-up detection path during the power-up mode and to select the normal detection path when not in the power-up mode. The power-up detection path includes voltage regulation circuitry that does not rely on a reference voltage. In one embodiment, the power-up detection path includes a logic gate coupled to receive the signal from the voltage detector. The logic gate is skewed to have a trip point that corresponds to voltage level slightly greater than that of the external supply voltage. The logic gate controls the on-chip voltage generator to maintain the on-chip-generated voltage level at a magnitude greater than that of the external supply voltage. During power-up, the power-up detection circuit selects the power-up detection path, thereby avoiding the need to disable the on-chip voltage generator as in conventional systems that depend on a reference voltage.

33 Claims, 2 Drawing Sheets

ON-CHIP-GENERATED SUPPLY VOLTAGE REGULATOR WITH POWER-UP MODE

FIELD OF THE INVENTION

The present invention relates to integrated circuit regulator circuits and, more particularly, to regulator circuits for on-chip voltage generators.

BACKGROUND INFORMATION

Integrated circuits (i.e., chips) typically receive at least one supply voltage from an external power source. When the voltage is first applied to a chip, the chip undergoes "power-up", as the voltage on the chip's supply buses stabilizes at the supply voltage level. The duration of power-up generally depends on the capacitive loading of the supply buses and the slew rate of the supply voltages.

In addition, some chips include an "on-chip" voltage generator to generate a supply voltage that is not provided externally, but is used internally by the integrated circuit. For example, in some integrated circuit memory devices, a boosted voltage supply is used in boosted word line designs or to provide rail-to-rail output signals with N-channel pull-up devices in output circuits. However, the boosted voltage must be tightly regulated to save power and prevent damage to other circuit devices.

FIG. 1 shows a regulator system 10 for an on-chip-generated supply voltage. System 10 includes a voltage divider 11, a voltage reference 13, a threshold detector 15 and a buffer 16. Voltage divider 11 is connected to receive the boosted supply voltage $V_H$ and output to threshold detector 15 a voltage $V_{SH}$ having a value that is a scaled version of (i.e., proportional) the value of the boosted supply voltage $V_H$. Threshold detector 15 then compares scaled voltage $V_{SH}$ from voltage divider 11 to a reference voltage $V_{REF}$ from voltage reference 13. Voltage divider 11 and voltage reference 13 are designed so that, ideally, their output voltages $V_{SH}$ and $V_{REF}$ have the same value when the value of boosted supply voltage $V_H$ is at the desired level. Threshold detector 15 compares the levels of voltages $V_{SH}$ and $V_{REF}$ and generates an output signal with a logic level indicative of whether the value of scaled voltage $V_{SH}$ is greater than or less than reference voltage $V_{REF}$. The output signal of threshold detector 15 is propagated to buffer 16, which outputs a boost control signal BC. Boost control signal BC is propagated to a charge pump (not shown) to control the activation and deactivation of the charge pump. In particular, the charge pump is configured to be activated when the logic level of signal BC indicates that the value of scaled voltage $V_{SH}$ is lower than reference voltage $V_{REF}$ and to be de-activated when signal BC indicates that the value of scaled voltage $V_{SH}$ is equal to or greater than reference voltage $V_{REF}$. Thus, during power-up the charge pump is disabled until voltage $V_{REF}$ reaches its desired level.

One problem with conventional system 10 is that voltage reference 13 generally does not accurately generate voltage $V_{REF}$ unless the supply voltage VDD is stable. Moreover, the accuracy of voltage reference 13 is generally not predictable during power-up. As a result, during power-up, threshold detector 15 may generate signal BC so as to limit on-chip-generated supply voltage $V_H$ below its desired level (i.e., underpumping). This underpumping may damage circuits that use on-chip-generated supply voltage $V_H$. For example, underpumping may result in latch-up of P-channel pass transistors in the charge pump (not shown). More specifically, underpumping may cause latch-up between voltages $V_H$ and VDD by forward biasing the source/drain regions with respect to the N-well of the P-channel pass transistors.

Waveform 21 in FIG. 2 represents the level of supply voltage VDD during power up. Ideally, voltage $V_H$ will ramp up so as to reach the desired level at about the same time as supply voltage VDD reaches its desired level, as indicated by waveform 22. However, the prior approach disables the charge pump (not shown) until supply voltage $V_{REF}$ reaches its desired level. Waveform 24 represents the level of supply voltage $V_{REF}$. When the level of supply voltage $V_{REF}$ reaches the desired level, the charge pump is enabled, causing the level of boosted voltage $V_H$ to increase. This delay in enabling the charge pump causes boosted voltage $V_H$ to reach its desired level later in time, as indicated by waveform 23. This delay undesirably increases the chip's power-up time and probability of latch-up. Accordingly, there is a need for a regulator system that more accurately regulates an on-chip-generated supply voltage during power-up.

SUMMARY

In accordance with the present invention, a regulator system for an on-chip-generated supply voltage is provided with a power-up mode. In one aspect of the present invention, the regulator system includes a voltage detector, a power-up mode detection circuit, a normal mode detection path, and a power-up detection path. The voltage detector monitors the on-chip-generated supply voltage and generates an output signal indicative of the level of the on-chip-generated supply voltage. The power-up mode detection circuit detects when the chip is in the power-up mode and generates a path select signal. The path select signal causes the regulator system to select the power-up detection path during the power-up mode and to select the normal detection path when not in the power-up mode.

The normal detection path generally includes conventional highly accurate voltage regulation circuitry to control the activation of the on-chip voltage generator. This conventional voltage regulation circuitry typically relies on a reference voltage that is generated from an external supply voltage.

In contrast, the power-up detection path includes voltage regulation circuitry that does not rely on the reference voltage. Instead, the power-up detection path controls the activation of the on-chip voltage generator as a function of the output signal of the voltage detector. In one embodiment, the voltage detector's output signal is a scaled version of the on-chip-generated voltage.

The power-up detection path includes a skewed logic gate connected to receive the output signal from the voltage detector. The output signal of the skewed logic gate is used to activate and deactivate the on-chip voltage generator. The skewed logic gate is designed to have a trip point that corresponds to the desired level of the on-chip-generated voltage when the external supply voltage has reached its normal operational level. However, because the external supply voltage is ramping up, the actual value of the trip point changes during power-up.

The skewing is predetermined so that the trip point of the skewed logic gate allows the level of the on-chip generated supply voltage to be greater in magnitude than that of the external supply voltage. Therefore, the skewed logic gate controls the activation of the on-chip voltage generator to maintain the on-chip-generated supply voltage at a greater level than the level of the external supply voltage. Maintaining the magnitude of the on-chip-generated supply voltage above that of the external supply voltage helps avoid the aforementioned latch-up problem and to reduce the time needed to ramp up the on-chip-generated supply voltage. In addition, the trip point of the skewed logic gate is also set to limit how much the on-chip-generated supply voltage can exceed the external supply voltage. This helps reduce the risk of causing breakdown in the circuitry coupled to the on-chip-generated supply voltage.

In another aspect of the present invention, the regulator system monitors the reference voltage so that when the reference voltage has reached the specified level during the power-up mode, the path select signal is transitioned so as to select the normal detection path. In this way, the regulator system uses the generally more accurate normal detection path as soon as practical.

BRIEF DESCRIPTION OF THE DRAWINGS

The foregoing aspects and many of the attendant advantages of this invention will become more readily appreciated by reference to the following detailed description, when taken in conjunction with the accompanying drawings listed below.

DETAILED DESCRIPTION

Figure 1:
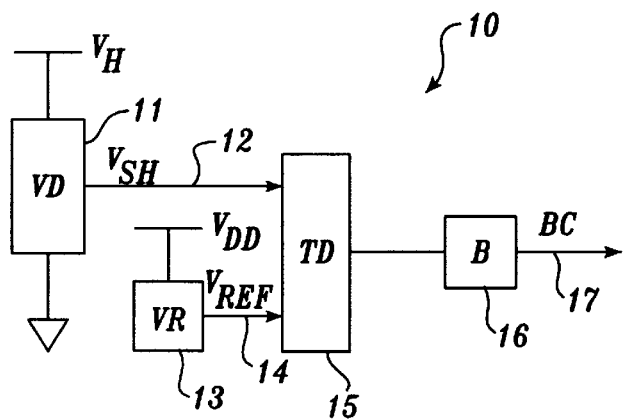
FIG. 1 is a block diagram illustrative of a conventional regulator system for an on-chip-generated supply voltage.
Figure 2:
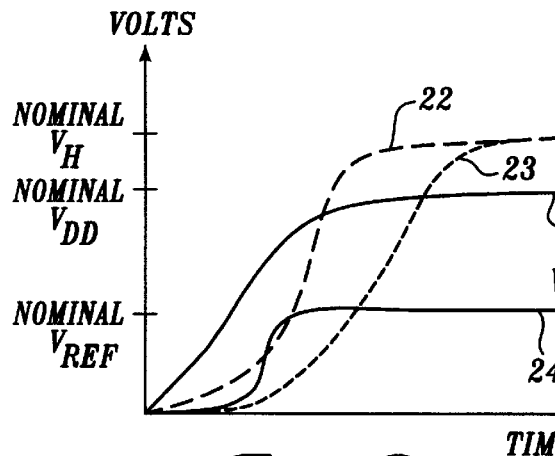
FIG. 2 is a diagram illustrative of the levels of the external and on-chip-generated supply voltages during power-up.
Figure 3:
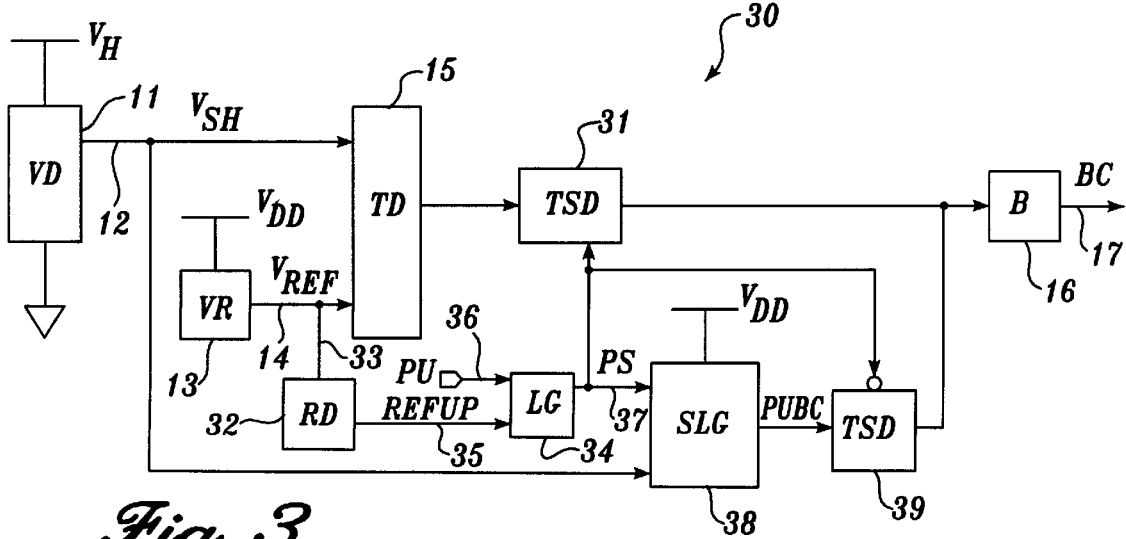
FIG. 3 is a block diagram illustrative of a regulator system for an on-chip-generated supply voltage, according to one embodiment of the present invention.

FIG. 3 is a block diagram illustrative of regulator system 30 for an on-chip-generated supply voltage, according to one embodiment of the present invention. For clarity, the same reference numbers are used between drawings to indicate elements having the same or similar function or structure. This embodiment of system 30 is similar to system 10 (FIG. 1), except that system 30 also includes a three-state driver (TSD) 31, a reference level detector 32, a logic gate 34, a skewed logic gate 38 and a second TSD 39 in addition to voltage detector 11, voltage reference 13, threshold detector 15, and buffer 16.

System 30 is interconnected in substantially the same manner as system 10 (FIG. 1), except for the additional circuitry. In particular, TSD 31 is connected between threshold detector 15 and buffer 16. That is, TSD 31 is connected to receive the output signal generated by threshold detector 15 and, when enabled, propagate this received signal to buffer 16. Reference detector 32 has an input lead 33 connected to output lead 14 of voltage reference 13. Reference detector 32 also has an output lead 35 connected to one input lead of logic gate 34. Logic gate 34 has an input lead 36 connected to receive a power-up signal PU that is deasserted when the chip is in power-up. Logic gate 34 also has an output lead 37 connected to an input lead of skewed logic gate 38 and to the enable input leads of TSDs 31 and 39. The output leads of TSDs 31 and 39 are connected to the input lead of buffer 16. The input lead of TSD 39 is connected to the output lead of skewed logic gate 38.

The path formed by threshold detector 15 and TSD 31 is referred to herein as the normal detection path. When enabled, the normal detection path operates in the same manner as described above for system 10 (FIG. 1). In general, the normal detection path is used after power-up is completed (i.e., when voltages VDD and $V_{REF}$ have reached predetermined levels). The path formed by skewed logic gate 38 and TSD 39 is referred to herein as the power-up detection path. The power-up detection path is used during power-up.

This embodiment of system 30 operates as follows. During power-up, signal PU and signal REFUP are deasserted. Of course, signals PU and REFUP can be either active-high or active-low signals as desired. Power-up signal PU is generated in a conventional manner by control circuitry (not shown) and signal REFUP is generated by reference detector 32. Reference detector 32 monitors voltage $V_{REF}$ provided by voltage reference 13 and asserts signal REFUP when voltage $V_{REF}$ is at about the normal operational level. One embodiment of reference detector 32 is disclosed in co-pending and commonly assigned U.S. patent application Ser. No. 09/128,576 filed by M. C. Stephens, Jr. on Aug. 4, 1998, entitled "Power-Up Stable Signal Detection Circuit", which is incorporated herein by reference.

Signals PU and REFUP are received by logic gate 34. Logic gate 34 is configured to select either the power-up detection path or the normal detection path in response to signals PU and REFUP. In particular, logic gate 34 is configured to select the normal detection path when signal PU and signal REFUP are asserted. Therefore, logic gate 34 is configured to select the power-up detection path when either signal PU is deasserted or when signal REFUP is deasserted. In this embodiment, logic gate 34 generates a path select signal PS, which when deasserted selects the normal detection path and when asserted selects the power-up detection path. More specifically, when deasserted, path select signal PS enables TSD 31 and disables TSD 39. As a result, in this case path select signal PS causes the normal detection path to be enabled and the power-up detection path to be disabled. In contrast, when asserted, path select signal PS disables TSD 31 and enables TSD 39. As a result, in this case path select signal PS causes the power-up detection path to be enabled and the normal detection path to be disabled.

In addition, in this embodiment, signal PS is received by skewed logic gate 38. Skewed logic gate 38 also receives scaled voltage $V_{SH}$ from voltage divider 11. At the start of power-up, path select signal PS also "enables" skewed logic gate 38. Skewed logic gate 38 is configured to generate a power-up boost control signal PUBC that is asserted when the level of voltage $V_{SH}$ is less than the trip point of skewed logic gate 38 and, conversely, to be deasserted when the level of voltage $V_{SH}$ is greater than the trip point. Although not as accurate in detecting the level of voltage $V_{SH}$ as threshold detector 15 during normal operation, the performance of skewed logic gate 38 is more suitable for detecting the level of voltage $V_{SH}$ during power-up when the accuracy of the level of boosted voltage $V_H$ is not as critical. The skewing of skewed logic gate 38 is predetermined to allow for a $V_H$ level that is greater in magnitude than that of external supply voltage VDD. In addition, the trip point of skewed logic gate 38 is set to limit the amount that the on-chip-generated supply voltage $V_H$ can exceed the external supply voltage VDD. This helps reduce the risk of causing breakdown in the circuitry that uses on-chip-generated supply voltage $V_H$. Skewed logic gate 38 is described below in more detail in conjunction with FIG. 4.

Signal PUBC generated by skewed logic gate 38 during power-up is then propagated through TSD 39 and buffer 16 to the on-chip voltage generator (not shown), which in this embodiment is a charge pump. As described above, TSD 39 is enabled when the power-up detection path is selected. As a result, buffer 16 outputs boost control signal BC as a function of signal PUBC during power-up mode. In this embodiment, power-up boost control signal PUBC is the inverse of boost control signal BC when the power-up detection path is selected. So when power-up boost control signal PUBC is asserted, boost control signal DC is deasserted, thereby causing the charge pump (not shown) to be deactivated. Conversely, when power-up boost control signal PUBC is deasserted, boost control signal BC is asserted to activate the charge pump. Of course, depending on the logic used, other embodiments may add or delete an inversion in the power-up detection path so that power-up boost control signal PUBC is not inverted compared to boost control signal BC. This feature of system 30 is advantageously used to control the activation of the charge pump (not shown) so that on-chip-generated supply voltage $V_H$ has a magnitude greater than that of external supply voltage VDD. Maintaining the magnitude of on-chip-generated supply voltage $V_H$ above that of external supply voltage VDD helps avoid the latch-up problem of the aforementioned conventional system and also helps minimize the time needed to ramp up the on-chip-generated supply voltage.

During power-up, reference detector 32 monitors reference voltage $V_{REF}$ from voltage reference 13. When reference voltage $V_{REF}$ reaches the desired level, as described in the aforementioned Ser. No. 09/128,576 application, reference detector 32 is configured to assert signal REFUP on lead 35. In response to signal REFUP being asserted and signal PU being asserted, logic gate 34 deasserts signal PS to enable TSD 31 and disable TSD 39. Thus, the power up detection path is disabled and the normal mode detection path is enabled.

The normal power-up sequence will typically progress as follows. During power-up, signals PU and REFUP are deasserted, thereby selecting the power-up detection path. Thus, skewed logic gate 38 controls the activation of the charge pump (not shown) to maintain on-chip generated supply voltage $V_H$ at a level greater in magnitude than that of external supply voltage VDD. After a period of time, external supply voltage VDD reaches a predetermined level, causing signal PU to he asserted. Afterwards, reference voltage $V_{REF}$ reaches a predetermined level, which is detected by reference detector 32. Reference detector 32 then asserts signal REFUP. When PU and REFUP are asserted, the normal detection path (i.e., which uses threshold detector 15) is selected, which more accurately controls the level of on-chip-generated voltage $V_H$ as described above for conventional system 10 (FIG. 1).

An alternative embodiment can be advantageously used in chips in which it is known that voltage $V_{REF}$ will be the last voltage to ramp up. In this alternative embodiment, logic gate 34 in FIG. 3 can be replaced with an inverter connected between leads 35 and 37. Still further, in another alternative embodiment, skewed logic gate 38 may be implemented with a skewed inverter connected to receive scaled voltage $V_{SH}$ from voltage divider 11. However, this embodiment dissipates more DC power than the skewed NAND gate embodiment In this alternative embodiment, path select signal PS is generated as described above to select between the normal and power-up detection paths, but is not received by the skewed logic gate 38.

Figure 4:
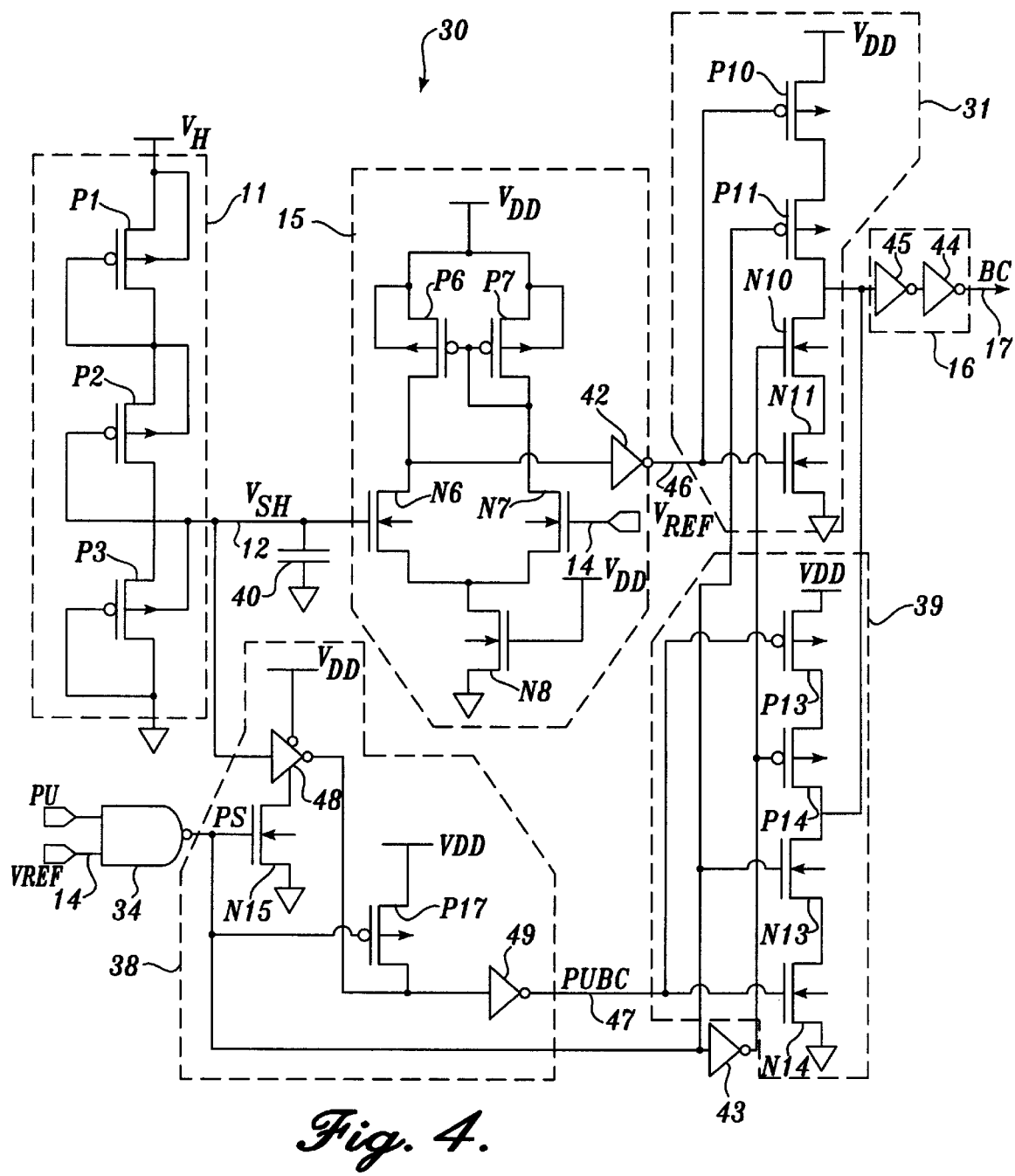
FIG. 4 is schematic diagram illustrative of the regulator system depicted in FIG. 3, according to one embodiment of the present invention.

FIG. 4 is a schematic diagram illustrative of one implementation of the block diagram of system 30 (FIG. 3). In this embodiment, voltage divider 11 is implemented with three diode-connected P-channel transistors P1–P3. These diodes are connected in series between a boosted supply bus (i.e., carrying boosted supply voltage $V_H$) and a ground bus. More specifically, diode P1 is connected to conduct current between the boosted supply bus to diode P2. Diode P2 is connected to conduct this current to diode P3, which is connected to conduct this current to the ground bus. Lead 12, which carries voltage $V_{SH}$, is connected to the node connecting diode P2 to diode P3. In this embodiment, the sizes of P-channel transistors P1–P3 are predetermined so that the level of voltage $V_{SH}$ is about 1.4 volts when boosted voltage $V_H$ is at the proper level of about 5 volts. These voltage levels could be different for different technologies. A capacitor 40 is connected between lead 12 and the ground bus to ensure that the voltage level at lead 12 initializes at a logic low level during power-up.

In this embodiment, threshold detector 15 is implemented as a conventional differential amplifier using two P-channel transistors P6 and P7, three N-channel transistors N6–N8 and an inverter 42. The sources of P-channel transistors P6 and P7 are connected to a VDD supply bus that provides external supply voltage VDD. The gates of P-channel transistors P6 and P7 are connected to the drain of P-channel transistor P7. The drains of P-channel transistors P6 and P7 are respectively connected to the drains of N-channel transistors N6 and N7. In addition, the drain of N-channel transistor N6 is connected to the input lead of inverter 42. The gates of N-channel transistors N6 and N7 serve as the "positive" and "negative" terminals of the differential amplifier, respectively, with N-channel transistor N8 serving as a current source. Thus, when the level of voltage $V_{SH}$ is below the level of voltage $V_{REF}$, more current is conducted through N-channel transistor N7, thereby causing less current to be conducted by N-channel transistor N6. Consequently, the voltage level at the drain of N-channel transistor N6 rises to a logic high level, thereby causing inverter 42 to generate a logic low level signal at its output lead 46. Conversely, when the level of voltage $V_{SH}$ is equal to or greater than the level of voltage $V_{REF}$, more current is conducted through N-channel transistor N6, thereby pulling the voltage level at the drain of N-channel transistor N6 to a logic low level. Consequently, inverter 42 generates a logic high level signal at output lead 46.

TSD 31 is implemented with two P-channel transistors P10 and P11 and two N-channel transistors N10 and N11. TSD 31 is interconnected as follows. P-channel transistor P10 has its source connected to the VDD supply bus, its gate connected to output lead 46 of inverter 42 (i.e., the output lead of threshold detector 15) and its drain connected to the source of P-channel transistor P11. P-channel transistor P11 has its gate connected to the output lead of logic gate 34, which in this embodiment is a two-input NAND gate coupled to receive signals PU and REFUP (see FIG. 3). The drain of P-channel transistor P11 is connected to the input lead of buffer 16 and to the drain of N-channel transistor N10. N-channel transistor N10 has its gate connected to the output lead of an inverter 43, which has its input lead connected to receive path select signal PS generated by logic gate 34. The source of N-channel transistor N10 is connected to the drain of N-channel transistor N11. N channel transistor N11 has its gate connected to output lead 46 of inverter 42 and its source connected to the ground bus.

In the conventional manner, TSD 31 is enabled by path select signal PS and its inverse generated by inverter 43. In particular, a logic low level of path select signal PS turns on P-channel transistor P11, while the output signal of inverter 43 (i.e., the inverse of path select signal PS) turns on N-channel transistor N10. As a result, TSD 31 is enabled.

Conversely, when path select signal PS is at a logic high level, transistors P11 and N10 are turned off, thereby disabling TSD 31.

The output signal generated by threshold detector 15 at output lead 46 serves as the input signal to TSD 31. When TSD 31 is enabled, P-channel transistors P10 and P11, together with N-channel transistors N10 and N11, form a conventional CMOS inverter. As a result, when enabled, TSD 31 inverts the output signal received from threshold detector 15 and provides this inverted signal to buffer 16. Buffer 16 is implemented with two inverters 44 and 45 connected in cascade.

TSD 39 is substantially identical to TSD 31, except that TSD 39 is connected to receive path select signal PS and its inverse with the opposite polarity as TSD 31. In addition, the input signal to TSD 39 is generated by skewed logic gate 38 instead of threshold detector 15. In particular, TSD 39 is implemented with two P-channel transistors P13 and P14 and two N-channel transistors N13 and N14.

TSD 39 is interconnected as follows. P-channel transistor P13 has its source connected to the VDD supply bus, its gate connected to an output lead 47 of skewed logic gate 38 and its drain connected to the source of P-channel transistor P14. P-channel transistor P14 has its gate connected to the output lead of inverter 43 to receive the inverse of path select signal PS. The drain of P-channel transistor P14 is connected to the input lead of buffer 16 and to the drain of N-channel transistor N13. N-channel transistor N13 has its gate connected to receive path select signal PS generated by logic gate 34. The source of N-channel transistor N13 is connected to the drain of N-channel transistor N14. N-channel transistor N14 has its gate connected to output lead 47 of skewed logic gate 38 and its source connected to the ground bus.

In the conventional manner, TSD 39 is enabled by path select signal PS and its inverse generated by inverter 43. In particular, when path select signal PS is at a logic high level, the logic low level signal generated by inverter 43 turns on P-channel transistor P14, while the logic high level of path select signal PS turns on N-channel transistor N13. As a result, TSD 39 is enabled. Conversely, when path select signal PS is at a logic low level, transistors P14 and N13 are turned off, thereby disabling TSD 39.

The output signal generated by skewed logic gate 38 at output lead 47 serves as the input signal to TSD 39. When TSD 39 is enabled, P-channel transistors P13 and P14 together with N-channel transistors N13 and N14 form a conventional CMOS inverter. As a result, when enabled, TSD 39 inverts the output signal received from skewed logic gate 38 and provides this inverted signal to buffer 16.

In this embodiment, skewed logic gate 38 is a two-input NAND gate connected to receive path select signal PS at one input lead and voltage $V_{SH}$ at the other input lead. More particularly, skewed logic gate 38 includes a logic gate 48, an inverter 49, an N-channel transistor N15 and a P-channel transistor P17. Skewed logic gate is interconnected as follows. Logic gate 48 is essentially a conventional CMOS inverter having a P-channel pull-up device with its source connected to N-channel pull-down device with its source connected to the drain of N-channel transistor N15. The source of N-channel transistor N15 is connected to the ground bus. The gate of N-channel transistor N15 is connected to receive path select signal PS. The input lead of logic gate 48 is connected to receive scaled voltage $V_{SH}$, whereas the output lead of logic gate 48 is connected to the input lead of inverter 49. In addition, the output lead of logic gate 48 is connected to P-channel transistor P17, which serves as a pull-up device controlled by path select signal PS. Thus, logic gate 48, N-channel transistor N15 and P-channel transistor P17 form a conventional NAND gate. Consequently, when signal PS is at a logic high level (i.e., when the power-up detection path is selected), skewed logic gate 38 functions, in effect, as a skewed buffer (i.e., the NAND gate followed by inverter 49) receiving scaled voltage $V_{SH}$.

Figure 5:
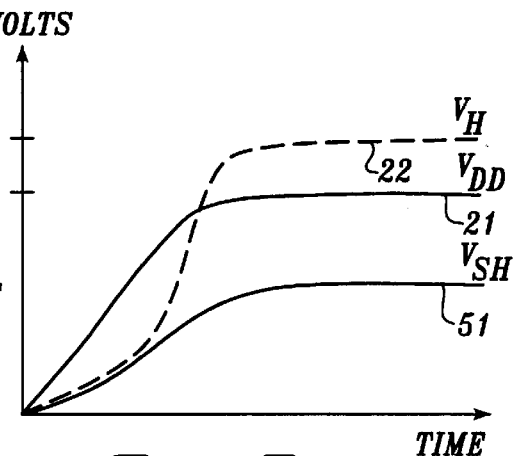
FIG. 5 is a diagram illustrative of the levels of voltages during power-up in the regulator system of FIG. 4.

As previously described, because external supply voltage VDD is also ramping up, this trip point changes during power-up. Consequently, the scaling provided by voltage detector 11 and the skewing of the trip point is predetermined so that the magnitude of the trip point would be slightly above that of scaled voltage $V_{SH}$ when on-chip-generated voltage $V_H$ is about equal to external supply voltage VDD. In this way, the magnitude of scaled voltage $V_{SH}$ is below that of the trip point when the magnitude of on-chip-generated voltage $V_H$ is below that of external supply voltage VDD. Thus, during power-up, when the level of voltage $V_{SH}$ is below this trip point, logic gate 48 will generate at logic high level signal at the input lead of inverter 49. Conversely, during power-up, when the level of voltage $V_{SH}$ is equal to or above the trip point, logic gate 48 will provide a logic low level signal to inverter 49. The ramping up of the voltage levels of voltages $V_{DD}$ and $V_H$ using system 30 are illustrated in FIG. 5 by wave forms 21 and 22, respectively. FIG. 5 also includes a waveform 51 representing the level of voltage $V_{SH}$.

The skewing of skewed logic gate 38 can be accomplished by appropriately selecting the sizes of the transistors in skewed logic gate 38. For example, in one embodiment, the width-to-length ratios of N-channel transistor N15, P-channel transistor P17, the N-channel transistor of logic gate 48 and the P-channel transistor of logic gate 48 are about 8, 6, 7, and 6, respectively. Of course, these ratios are also process-dependent and may be different for other fabrication processes.

When path select signal PS is at a logic low level (i.e., the normal detection path is selected), N-channel transistor N15 is turned off, and P-channel transistor P17 is turned on. Consequently, the output lead of logic gate 48 is pulled up to a logic high level, which causes inverter 49 to generate signal PUBC with a logic low level. However, because the logic low level of path select signal PS disables TSD 39, signal PUBC is not propagated to buffer 16.

The embodiments of the regulator system described above are illustrative of the principles of the present invention and are not intended to limit the invention to the particular embodiments described. For example, those skilled in the art, in light of this disclosure, can implement, without undue experimentation, other embodiments of the skewed logic gate that are different from the skewed logic gate described, but achieve the same function. Further, those skilled in the art can also implement other embodiments for use with negative on-chip-generated supply voltages. Accordingly, while the preferred embodiment of the invention has been illustrated and described, it will be appreciated that various changes can be made therein without departing from the spirit and scope of the invention.

We claim:

1. A method of regulating a supply voltage generated by an on-chip voltage generator implemented on a chip, the chip configured to receive an external supply voltage and having an on-chip regulated reference voltage supply that provides a reference voltage, the method comprising:

providing a first signal representing a level of the on-chip-generated supply voltage using a voltage detector;

detecting when the chip enters a power-up mode using a first circuit;

enabling a power-up detection path when the power-up mode is detected using the first circuit, the power-up detection path being coupled to receive the first signal;

when the power-up detection path is enabled, generating a control signal as a function of at least the first signal and independently of the reference voltage using a second circuit, the control signal being received by the on-chip voltage generator, and monitoring the reference voltage during the power-up mode and, when the reference voltage reaches a predetermined level, disabling the power-up detection path and enabling the normal detection path;

enabling a normal detection path when the power-up mode is not detected using the first circuit, the normal detection path being coupled to receive the first signal and the reference voltage; and when the normal detection path is enabled, generating the control signal in response to the first signal and the reference voltage using a third circuit.

2. The method of claim 1 further comprising monitoring the external supply voltage and the reference voltage during the power-up mode and, when the external supply voltage and the reference voltage reach predetermined levels, disabling the power-up detection path and enabling the normal detection path.

3. A method of regulating a supply voltage generated by an on-chip voltage generator implemented on a chip, the chip configured to receive an external supply voltage and having an on-chip regulated reference voltage supply that provides a reference voltage, the method comprising:

providing a first signal representing a level of the on-chip-generated supply voltage using a voltage detector;

detecting when the chip enters a power-up mode using a first circuit;

enabling a power-up detection path when the power-up mode is detected using the first circuit, the power-up detection path being coupled to receive the first signal when the power-up detection path is enabled, generating a control signal as a function of at least the first signal and independently of the reference voltage using a second circuit, the control signal being received by the on-chip voltage generator wherein, when the power-up detection path is enabled, the control signal controls the activation of the on-chip voltage generator so as to maintain the supply voltage at a level having a magnitude greater than that of the external supply voltage;

enabling a normal detection path when the power-up mode is not detected using the first circuit, the normal detection path being coupled to receive the first signal and the reference voltage; and when the normal detection path is enabled, generating the control signal in response to the first signal and the reference voltage using a third circuit.

4. The method of claim 1 wherein enabling the normal detection path concurrently disables the power-up detection path and wherein enabling the power-up detection path concurrently disables the normal detection path.

5. The method of claim 1 wherein the voltage detector includes a voltage divider connected to receive the on-chip-generated supply, and wherein the third circuit includes a differential amplifier coupled to receive the first signal and the reference voltage.

6. A method of regulating a supply voltage generated by an on-chip voltage generator implemented on a chip, the chip configured to receive an external supply voltage and having an on-chip regulated reference voltage supply that provides a reference voltage, the method comprising:

providing a first signal representing a level of the on-chip-generated supply voltage using a voltage detector;

detecting when the chip enters a power-up mode using a first circuit;

enabling a power-up detection path when the power-up mode is detected using the first circuit, the power-up detection path being coupled to receive the first signal, when the power-up detection path is enabled, generating a control signal as a function of at least the first signal and independently of the reference voltage using a second circuit, the control signal being received by the on-chip voltage generator, wherein enabling the power-up detection path comprises generating a path select signal as a function of a received power-up signal, the path select signal being received by a first three-state driver (TSD) in the power-up detection path, the power-up signal indicating whether the chip is in the power-up mode, and wherein the path select signal enables the first TSD when in a first logic level and disables the first TSD when in a second logic level;

enabling a normal detection path when the power-up mode is not detected using the first circuit, the normal detection path being coupled to receive the first signal and the reference voltage; and when the normal detection path is enabled, generating the control signal in response to the first signal and the reference voltage using a third circuit.

7. The method of claim 6 wherein the first circuit includes a NAND gate coupled to receive the power-up signal and a reference up signal, the reference up signal being generated as a function of the level of the reference voltage.

8. The method of claim 6 wherein enabling the power-up detection path further comprises generating the path select signal as a function of the received power-up signal and the level of the reference voltage.

9. The method of claim 6 wherein the normal detection path includes a second TSD, the second TSD being coupled to receive the path select signal, the second TSD being configured to be enabled and disabled when the path select signal is in the second and first logic levels, respectively.

10. The method of claim 6 wherein the second circuit includes a skewed logic gate, the skewed logic gate being coupled to receive the first signal and the path select signal.

11. A circuit implemented on a chip for regulating a supply voltage generated by an on-chip voltage generator, the chip being configured to receive an external supply voltage and having an on-chip regulated reference voltage supply configured to provide a reference voltage, the circuit comprising:

means for providing a signal representing a level of the on-chip-generated supply voltage;

means for detecting when the chip enters a power-up mode;

means for enabling the power-up detection path when the power-up mode is detected, the power-up detection path being coupled to receive the signal;

a power-up detection path comprising:

means for generating a control signal when the power-up detection path is enabled in response to the signal independently of the reference voltage, the control signal being received by the on-chip voltage generator, and means for monitoring the reference voltage during the power-up mode wherein, when the reference voltage reaches a predetermined level, the means for monitoring the reference voltage causes the means for enabling the power-up detection path to disable the power-up detection path and causes the means for enabling the normal detection path to enable the normal detection path;

means for enabling the normal detection path when the power-up mode is not detected, the normal detection path being coupled to receive the signal and the reference voltage; and a normal detection path comprising means for generating the control signal when the normal detection path is enabled in response to the signal and the reference voltage.

12. The circuit of claim 11 wherein the means for monitoring the reference voltage is further configured to monitor the external supply voltage during the power-up mode and to cause the means for enabling the power-up detection path to disable the power-up detection path and causes the means for enabling the normal detection path to enable the normal detection path when the reference voltage and the external supply voltage reach predetermined levels.

13. The circuit of claim 11 wherein the means for enabling the normal detection path is also configured to concurrently disable the power-up detection path.

14. The circuit of claim 11 wherein the means for enabling the power-up detection path is also configured to concurrently disable the normal detection path.

15. A circuit implemented on a chip for regulating a supply voltage generated by an on-chip voltage generator, the chip being configured to receive an external supply voltage and having an on-chip regulated reference voltage supply configured to provide a reference voltage, the circuit comprising:

means for providing a signal representing a level of the on-chip-generated supply voltage;

means for detecting when the chip enters a power-up mode;

means for enabling the power-up detection path when the power-up mode is detected, the power-up detection path being coupled to receive the signal;

a power-up detection path comprising means for generating a control signal when the power-up detection path is enabled in response to the signal independently of the reference voltage, the control signal being received by the on-chip voltage generator;

means for enabling the normal detection path when the power-up mode is not detected, the normal detection path being coupled to receive the signal and the reference voltage; and a normal detection path comprising means for generating the control signal when the normal detection path is enabled in response to the signal and the reference voltage, wherein the normal detection path further comprises a first three-state driver (TSD) and wherein the power-up detection path further comprises a second TSD.

16. The circuit of claim 15 wherein the means for enabling the power-up detection path comprises means for generating a path select signal as a function of a received power-up signal, the path select signal being received by the first TSD, and the power-up signal indicating whether the chip is in the power-up mode, the path select signal enabling the first TSD when in a first logic level and disabling the first TSD when in a second logic level.

17. The circuit of claim 16 wherein the second TSD is coupled to receive the path select signal, the second TSD being configured to be enabled and disabled when the path select signal is in the second and first logic levels, respectively.

18. The circuit of claim 16 wherein the means for generating the path select signal is further configured to generate the path select signal as a function of the received power-up signal and the level of the reference voltage.

19. The circuit of claim 16 wherein the means for generating the control signal when the power-up detection path is enabled comprises a skewed logic gate, the skewed logic gate being coupled to receive the signal and the path select signal.

20. The circuit of claim 11 wherein the means for generating the control signal when the power-up detection path is enabled is configured to activate the on-chip voltage generator so as to maintain the supply voltage at a level having a magnitude greater than that of the external supply voltage.

21. A circuit implemented on a chip for regulating an on-chip generated supply voltage generated by an on-chip voltage generator, the chip being configured to receive an external supply voltage having an on-chip regulated reference voltage supply configured to provide a reference voltage, the circuit comprising:

a voltage detection circuit coupled to receive the on-chip-generated supply voltage;

a power-up mode detection circuit coupled to receive a power up signal that is asserted when the chip is in a power-up mode;

a power-detection path coupled to receive the signal, the power-up detection path comprising a first logic gate, wherein, when the power-up detection path is enabled, the first logic gate being configured to generate a control signal in response to the signal independently of the reference voltage and to generate the control signal so as to control the on-chip voltage generator to maintain the supply voltage at a level having a magnitude greater than that of the external supply voltage; and a normal detection path coupled to receive the signal and the reference voltage, the normal detection path comprising a threshold detector, wherein, when the normal detection path is enabled, the threshold detector is configured to generate the control signal as a function of the signal and the reference voltage.

22. The circuit of claim 21 further comprising a reference detector configured to monitor the reference voltage during the power-up mode wherein, when the reference voltage reaches a predetermined level, the reference detector is configured to cause the power-up detection path to be disabled and the normal detection path to be enabled.

23. The circuit of claim 22 wherein the power-up mode detection circuit is further coupled to the reference detector, the power-up mode detection circuit being further configured to generate a path select signal as a function of an output signal of the reference detector and the power-up signal.

24. The circuit of claim 23 wherein the power-up mode detection circuit comprises a NAND gate.

25. A circuit implemented on a chip for regulating an on-chip generated supply voltage generated by an on-chip voltage generator, the chip being configured to receive an external supply voltage having an on-chip regulated reference voltage supply configured to provide a reference voltage, the circuit comprising:

a voltage detection circuit coupled to receive the on-chip-generated supply voltage;

a power-up mode detection circuit coupled to receive a power up signal that is asserted when the chip is in a power-up mode;

a power detection path coupled to receive the signal, the power-up detection path comprising a first logic gate, wherein, when the power-up detection path is enabled, the first logic gate is configured to generate a control signal in response to the signal independently of the reference voltage; and a normal detection path coupled to receive the signal and the reference voltage, the normal detection path comprising a threshold detector, wherein, when the normal detection path is enabled, the threshold detector is configured to generate the control signal as a function of the signal and the reference voltage, wherein the normal detection path further comprises a first three-state driver (TSD) and wherein the power-up detection path further comprises a second TSD.

26. The circuit of claim 25 wherein the first TSD is coupled to receive the path select signal, the path select signal enabling the first TSD when in a first logic level and disabling the first TSD when in a second logic level.

27. The circuit of claim 26 wherein the second TSD is coupled to receive the path select signal, the path select signal enabling the second TSD when in the second logic level and disabling the second TSD when in the first logic level.

28. The circuit of claim 26 wherein the fist logic gate is a skewed logic gate having an input lead coupled to receive the signal, the first logic gate being skewed to have a trip point corresponding to a desired level of the on-chip-generated supply voltage so that when the signal has a level less than the trip point during the power-up mode, the first logic gate is configured to generate the control signal so as to enable the on-chip voltage generator and when the signal has a level greater than or equal to the trip point during the power-up mode, the first logic gate is configured to generate the control signal so as to disable the on-chip voltage generator.

29. The circuit of claim 26 wherein the first logic gate is a skewed NAND gate coupled to receive the signal and the path select signal.

30. The circuit of claim 26 wherein when the path select signal is at a logic high level, the first logic gate is configured to output the control signal with a relatively fast low-to-high transition and a relatively slow high-to-low transition.

31. The method of claim 3 further comprising monitoring the reference voltage during the power-up mode and, when the reference voltage reaches a predetermined level, disabling the power-up detection path and enabling the normal detection path.

32. The circuit of claim 15 further comprising means for monitoring the reference voltage during the power-up mode wherein, when the reference voltage reaches a predetermined level, the means for monitoring the reference voltage causes the means for enabling the power-up detection path to disable the power-up detection path and causes the means for enabling the normal detection path to enable the normal detection path.

33. The circuit of claim 25 wherein the first logic circuit is further configured to generate the control signal so as to control the on-chip voltage generator to maintain the supply voltage at a level having a magnitude greater than that of the external supply voltage.

* * * * *